(12) United States Patent
Tan et al.

(10) Patent No.: US 8,097,089 B2
(45) Date of Patent: Jan. 17, 2012

(54) METHODS FOR CLEANING PROCESS KITS AND CHAMBERS, AND FOR RUTHENIUM RECOVERY

(75) Inventors: Samantha S. H. Tan, Fremont, CA (US); Jianqi Wang, Fremont, CA (US)

(73) Assignee: Quantum Global Technologies LLC, Dublin, PA (US)

( * ) Notice: Subject to any disclaimer, the term of this patent is extended or adjusted under 35 U.S.C. 154(b) by 517 days.

(21) Appl. No.: 12/339,037

(22) Filed: Dec. 18, 2008

(65) Prior Publication Data

US 2009/0197004 A1 Aug. 6, 2009

Related U.S. Application Data

(60) Provisional application No. 61/015,068, filed on Dec. 19, 2007.

(51) Int. Cl.
*H01G 9/04* (2006.01)
(52) U.S. Cl. ............... 134/1.3; 510/175; 510/176
(58) Field of Classification Search ........... 510/175; 134/1.3
See application file for complete search history.

(56) References Cited

U.S. PATENT DOCUMENTS

| | | | |
|---|---|---|---|
| 4,002,470 A | 1/1977 | Isa et al. | |
| 4,282,112 A | 8/1981 | Fitoussi et al. | |
| 4,450,056 A * | 5/1984 | Gray | 205/534 |
| 5,028,385 A * | 7/1991 | Baldi | 419/8 |
| 5,265,304 A | 11/1993 | Hughes | |
| 5,651,723 A | 7/1997 | Bjornard et al. | |
| 6,394,023 B1 | 5/2002 | Crocker | |
| 6,565,672 B2 * | 5/2003 | Spitsberg et al. | 148/277 |
| 6,607,605 B2 | 8/2003 | Tan | |
| 6,810,887 B2 | 11/2004 | Tan | |
| 6,902,628 B2 | 6/2005 | Wang et al. | |
| 7,045,072 B2 | 5/2006 | Tan et al. | |
| 7,107,998 B2 | 9/2006 | Greer et al. | |
| 7,264,679 B2 | 9/2007 | Schweitzer et al. | |
| 2002/0071983 A1 * | 6/2002 | Rowen et al. | 429/34 |
| 2003/0168088 A1 | 9/2003 | Watanabe et al. | |
| 2004/0011385 A1 | 1/2004 | Henderson et al. | |

(Continued)

FOREIGN PATENT DOCUMENTS

JP 58-194745 11/1983

OTHER PUBLICATIONS

International Preliminary Report on Patentability and Written Opinion of International Application No. PCT/US2008/087551 mailed Jul. 1, 2010.

(Continued)

*Primary Examiner* — Gregory Webb
(74) *Attorney, Agent, or Firm* — Fox Rothschild LLP

(57) ABSTRACT

A method is provided for recovering a metal from electronic device deposition equipment including: providing deposition equipment wherein the deposition equipment is at least partially coated with a deposited metal; blasting the deposition equipment with a grit to remove at least some of the deposited metal to form a blasted grit and a removed metal; and separating at least some of the removed metal from the blasted grit to form a recovered metal.

17 Claims, 3 Drawing Sheets

U.S. PATENT DOCUMENTS

| | | | |
|---|---|---|---|
| 2004/0031692 A1* | 2/2004 | Hardee | 205/118 |
| 2005/0089699 A1 | 4/2005 | Lin et al. | |
| 2006/0124583 A1* | 6/2006 | Kukanskis et al. | 216/13 |
| 2006/0198081 A1* | 9/2006 | Seitz et al. | 361/508 |
| 2007/0138601 A1* | 6/2007 | Fan et al. | 257/632 |
| 2007/0235059 A1 | 10/2007 | Chu et al. | |
| 2008/0099054 A1 | 5/2008 | Rabinovich et al. | |
| 2008/0193850 A1* | 8/2008 | Ellis | 429/234 |

OTHER PUBLICATIONS

International Search Report and Written Opinion of International Application No. PCT/US2008/087551 mailed Jul. 31, 2009.

U.S. Appl. No. 10/696,394, filed Oct. 28, 2003.

* cited by examiner

METHODS FOR CLEANING PROCESS KITS AND CHAMBERS, AND FOR RUTHENIUM RECOVERY

The present application claims priority from the following U.S. Provisional Patent Application, which is hereby incorporated by reference herein in its entirety:

U.S. Provisional Patent Application Ser. No. 61/015,068, filed Dec. 19, 2007, and entitled "Methods for Cleaning Process Kits and Chambers, and for Ruthenium Recovery".

FIELD OF THE INVENTION

The present invention relates to electronic device manufacturing, and, more specifically, to methods for cleaning ruthenium deposition process kits and chambers and recovering ruthenium (Ru) used during the manufacture of electronic devices.

BACKGROUND OF THE INVENTION

Some electronic devices are manufactured using the following four layer structure, listed in order of deposition on a substrate: tantalum nitride (TaN), tantalum (Ta), copper seed (Cu-seed) and copper (Cu). Such a structure may require four deposition steps, with each step taking time to employ, requiring the use of potentially hazardous reagents and resulting in potentially hazardous effluent. In order to reduce the number of deposition steps, some manufacturers have substituted ruthenium for tantalum. This substitution has enabled the manufacturers to eliminate the copper seed layer, which may be used only to enable copper to be deposited on tantalum. As copper can be deposited directly on ruthenium, a seed layer may not be necessary, and the structure may be created using only three deposition steps.

Accordingly, it is desirable to have a method for cleaning built up ruthenium from deposition equipment and to recover the ruthenium for re-use in the manufacture of electronic devices.

SUMMARY OF THE INVENTION

In one aspect, the invention provides a method for cleaning electronic device deposition equipment including: providing deposition equipment wherein the deposition equipment is at least partially coated with a deposited metal to be cleaned from the deposition equipment; and blasting the deposition equipment with a grit to remove at least some of the deposited metal.

In another aspect, the invention provides a method for recovering a metal from electronic device deposition equipment, including providing deposition equipment wherein the deposition equipment is at least partially coated with a deposited metal; blasting the deposition equipment with a grit to remove at least some of the deposited metal to form a blasted grit and a removed metal; and separating at least some of the removed metal from the blasted grit to form a recovered metal.

In yet another aspect, the invention provides a method of operating a metal deposition chamber including providing deposition equipment; depositing a metal on a substrate; inspecting the deposition equipment to determine whether more than a pre-selected thickness of metal has been deposited on the deposition equipment; grit blasting at least some of the deposited metal from the deposition equipment to form a grit/metal mixture; and recovering at least some of the metal from the grit/metal mixture.

Other features and aspects of the present invention will become more fully apparent from the following detailed description, the appended claims and the accompanying drawings.

DETAILED DESCRIPTION

Figure 1:
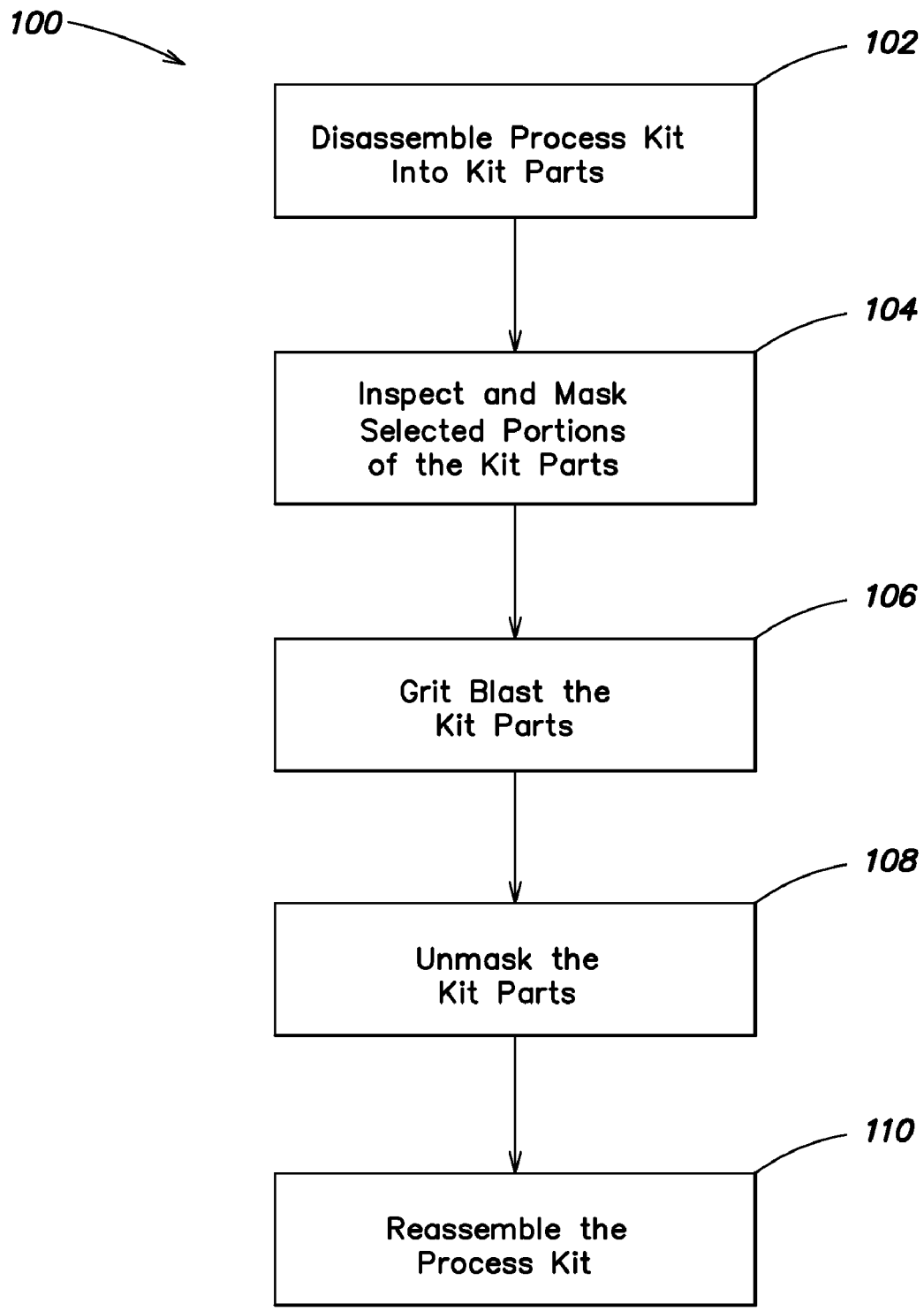
FIG. 1 is a flow chart of one or more embodiments of a cleaning method according to the present invention.

The use of ruthenium may have some drawbacks. First, ruthenium is relatively expensive. In addition, some ruthenium intended for deposition on a substrate during a deposition cycle may instead be deposited as a film or coating on deposition equipment, which may include a process kit and a deposition chamber. During each successive deposition cycle, ruthenium may continue to build up on the deposition equipment. Ruthenium may eventually build up to such an extent that the ruthenium may flake off the deposition equipment and land on the substrate. Ruthenium particles or flakes which land on the substrate may irreparably damage the substrate.

As described above, the manufacture of some electronic devices may include depositing a thin layer of ruthenium onto a substrate. For example, a layer of ruthenium may be deposited on a tantalum nitride layer, and a layer of copper may be built up on the ruthenium. Ruthenium deposition may typically be conducted in a deposition chamber (hereinafter the "chamber") using atomic layer deposition (ALD), physical vapor deposition (PVD) or any other suitable method of deposition. During atomic layer deposition or physical vapor deposition of ruthenium, some of the ruthenium which is intended to be deposited on the substrate may instead become deposited on a process kit or on surfaces of the chamber (hereinafter referred to collectively as the "deposition equipment"). In fact, up to about 30% or more of the ruthenium introduced into the chamber may become deposited on the deposition equipment. Eventually, ruthenium may build up on the equipment to such an extent that it may flake off of the equipment and fall onto the substrate. This may result in an irreparably damaged substrate which may need to be discarded.

Semiconductor substrates are typically very expensive and it is desirable to avoid damaging them. Methods for cleaning ruthenium from deposition equipment have therefore been developed. These known methods may help prevent ruthenium particles from building up on deposition equipment, so that the ruthenium does not fall on the substrate, but these known methods may also result in the loss of ruthenium, which is a relatively expensive metal. It is therefore desirable to not only clean ruthenium from the deposition equipment, but also to recover ruthenium from the deposition equipment for reuse in electronic device manufacturing processes, or for use in any other suitable process.

In some embodiments, the present invention provides methods for cleaning ruthenium deposits or coatings from deposition equipment by grit blasting the deposition equipment. Grit blasting may include directing a grit at a ruthenium coated surface at a controlled velocity and pressure. The grit may be a glass or aluminum oxide grit, for example. The grit which strikes the ruthenium coated deposition equipment may break up, chip off, or otherwise separate the ruthenium coating from the deposition equipment. When the deposition equipment is grit blasted for a sufficient period of time, some, most or all of the ruthenium may be cleaned from the surface, resulting in deposition equipment which may again be employed to deposit ruthenium or other materials on a substrate.

In other embodiments, a method for recovering ruthenium from deposition equipment is provided. In these embodiments, the ruthenium may be separated from the deposition equipment by the cleaning process described above. The grit used to separate the ruthenium from the deposition equipment may be selected for one or more grit properties, including the property that the grit may be dissolved in a medium which does not dissolve ruthenium to any significant extent. By not dissolving ruthenium to any significant extent is meant that any amount of ruthenium which may actually become dissolved is less than a pre-determined amount. The separated ruthenium, and the grit used to separate the ruthenium, may be collected following the grit blasting. The resulting grit/ruthenium mixture may then be treated with a first medium which may dissolve the grit, but which may not dissolve the ruthenium to any substantial extent. Once the grit dissolves, the medium and dissolved grit may be separated from the remaining solids, which may include ruthenium. The remaining solids may then be washed and filtered, leaving particles of ruthenium which may then be re-used.

In some embodiments, depending upon the grit used and the dissolution medium used, the solids remaining after treatment with the first medium may include impurities, in addition to particles of ruthenium. In these embodiments, the remaining solids may be treated with a second medium which may be selected such that the second medium may dissolve the impurities and may dissolve the ruthenium particles. After the second medium treatment, the remaining ruthenium particles may be washed and filtered to provide re-usable ruthenium.

In additional embodiments, methods of operating a ruthenium deposition chamber are provided. In these embodiments, a ruthenium deposition chamber may be operated in a conventional manner to deposit ruthenium on substrates. A deposition cycle may conventionally include the steps of placing a substrate in a chamber, depositing ruthenium onto the substrate and removing the substrate from the chamber. The present invention provides additional steps, which may include any or all of the following steps:
a) inspecting the deposition equipment on a periodic basis, for example, after a pre-selected number of process cycles;
b) determining if more than a pre-selected amount of ruthenium is found to have built up on the deposition equipment, and, if it has, taking the deposition equipment out of service cleaning it; and
c) recovering ruthenium, as described herein.

In another aspect, if upon inspection any ruthenium is found to have flaked off of the deposition equipment, the deposition equipment may be taken out of service and be cleaned, and, optionally, the ruthenium recovered, as described herein. Once cleaned, the deposition equipment may be returned to service, and the inspection process may begin again. Any recovered ruthenium may be re-used.

Cleaning Method

FIG. 1 depicts a flow chart of a method for cleaning deposition equipment 100 of the present invention. As described above, deposition equipment may include a process kit and a deposition chamber. Process kits used in semiconductor processing may include at least an inner shield, a cover ring, a deposition ring, a shutter disk, and an outer shield. These parts may be made from, for example, aluminum, titanium, stainless steel and ceramics. Other materials may be used. The following description will be exemplified using a process kit, but it is understood that the steps, where appropriate, may be used to clean a deposition chamber.

A process kit may be disassembled in step 102 into individual process kit parts (hereinafter "kit parts"). Disassembly may facilitate cleaning, by providing smaller kit parts to be cleaned and by eliminating hard to clean junctions between kit parts.

The kit parts may be inspected, and, if appropriate, masked in step 104. During the ruthenium deposition process, at least some of the kit parts may become at least partially coated with ruthenium. Conversely, some of the kit parts may include portions upon which ruthenium has not become deposited, hereinafter referred to as "non-deposited portions". It may not be necessary to clean the non-deposited portions, and, in fact, it may be desirable to protect these portions of the kit from some aspects of the cleaning process, as will be discussed in more detail below. Thus, in step 104, one or more portions of a kit part may be masked. Some kit parts may not require masking, and it is possible that some kit parts may not require cleaning.

Once a kit part has been inspected and, if appropriate, masked, the kit part may be cleaned by being grit blasted in step 106. Alternatively, the kit parts may be grit blasted without having been inspected or masked.

Kit parts may be grit blasted individually or in groups. Grit blasting may include driving grit particles against the kit part at a selected impact pressure. Typically, the grit particles may be driven by compressed air, or another suitable gas. Grits may be blasted by, e.g., a siphon feed or a pressure feed grit blaster, or any other suitable grit blaster.

Grit blasting may be performed manually, by a human operator controlling a grit blaster, or may be performed by a grit blasting machine, such as one which is controlled by an electronic computer or other programmable logic controller.

The grits which may be used to separate ruthenium from kit parts include glass beads, e.g., soda lime glass, and aluminum oxide particles. Other suitable grits may be used. The size of the grits may be between about #70 and about #36 mesh size. Other suitable grit sizes may be used.

The grit may be blasted at about 60 psi, or at any other suitable pressure. The time required to separate the ruthenium coating from a kit part may vary between about 5 to about 30 minutes depending upon several factors, including, e.g., the thickness of the ruthenium coating, the size and shape of the part and the grit blast materials and grit blast process conditions. Other suitable times may be used. In some embodiments, the part may be grit blasted until it is determined that less than a predetermined amount of ruthenium remains on the part or that any remaining ruthenium coating is less thick than a predetermined thickness. The determination of the amount of ruthenium remaining on the part may be made by a human operator, or may be sensed by a sensor which is controlled by a computer or other programmable logic controller. Alternatively, minimum cleaning times may be developed empirically or in any other appropriate way.

In some embodiments, the deposition equipment may, before it is put into service, be intentionally coated to enhance its performance. This intentional coating may be applied, for example, to reduce the deposition of ruthenium on the deposition equipment, or to facilitate the removal of any ruthenium which does deposit on the deposition equipment. One such coating may be an aluminum twin wire arc spray coating (Al TWAS). In these and other embodiments, the grit blasting of the deposition equipment may be stopped before the grit removes so much of the ruthenium coating that it begins to separate the Al TWAS from the deposition equipment. The protection of intentional performance enhancement coatings is one reason the non-deposited portions of the deposition equipment may be masked prior to grit blasting.

The grit blasting 106 may be conducted in a grit blasting chamber using fixed nozzles or movable nozzles, or in an automated grit blasting machine. If a deposition chamber is being blasted, a blast nozzle may be introduced into the deposition chamber and directed by a human operator or a robot controlled by a computer or other programmable logic controller.

The cleaned kit parts may be unmasked, step 108, and reassembled into process kits, step 110. In some embodiments, the kit parts may be further cleaned before being reassembled.

Ruthenium Recovery

Figure 2:
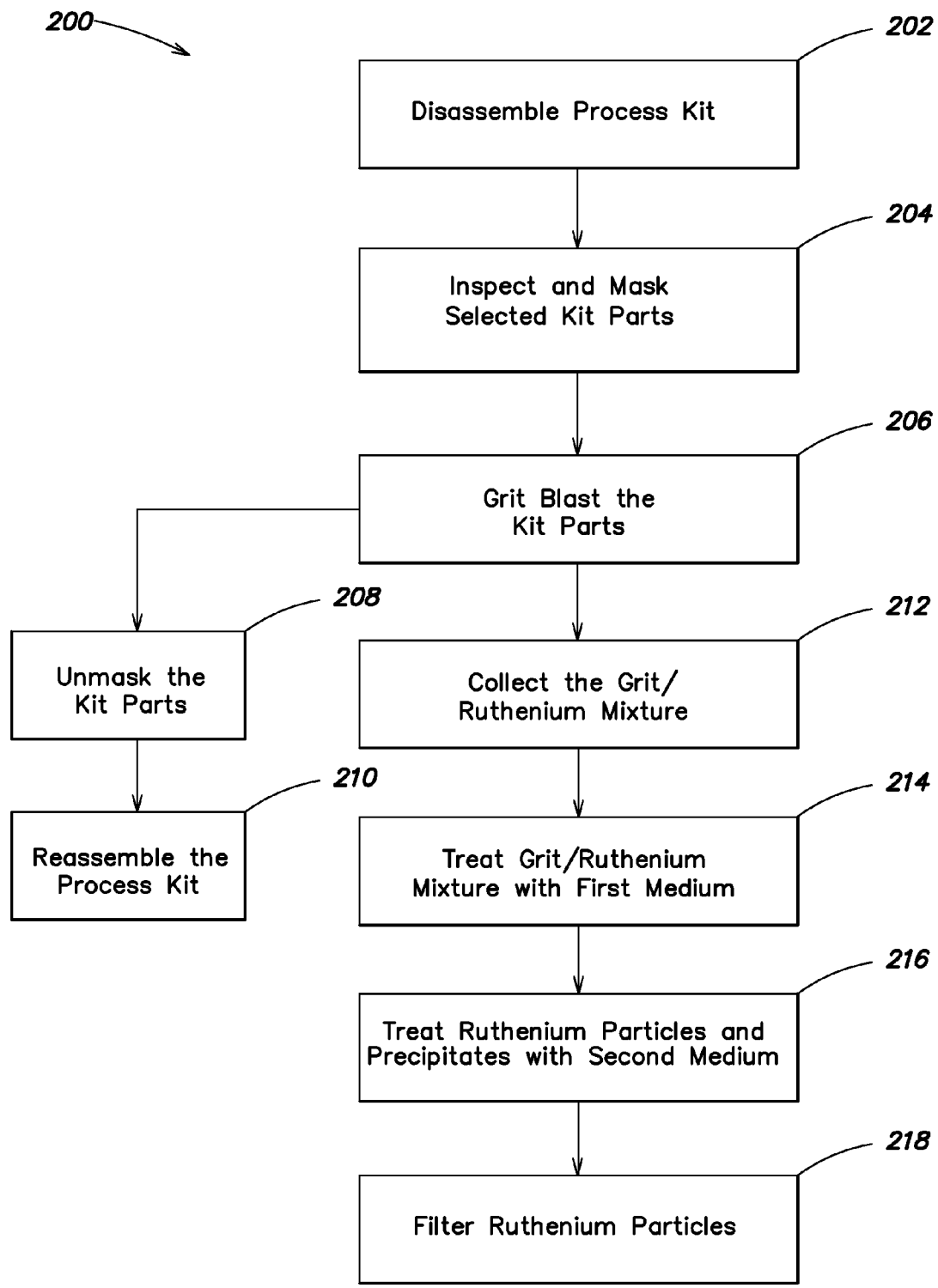
FIG. 2 is a flow chart of one or more embodiments of a method for recovering ruthenium according to the present invention.

FIG. 2 depicts a flow chart for a ruthenium recovery method 200 of the invention. In these and other embodiments, the process for cleaning the ruthenium from the deposition equipment may be substantially the same as the cleaning method described in cleaning method 100. Thus, for example, in method 200, process kit parts may be: disassembled, in step 202; inspected and masked, in step 204; grit blasted, in step 206; unmasked, in step 208; and reassembled into process kits, in step 210.

Following grit blasting, the grit, ruthenium and any other material blasted from the kit parts (hereinafter the 'grit/ruthenium mixture'), in step 206, may be collected, in step 212. The grit/ruthenium mixture may be swept or vacuumed from the grit blasting chamber or may be collected by any other suitable means.

The grit/ruthenium mixture may be treated with a first medium in step 214, to dissolve the grit. The treatment 214 may be conducted in any suitable vessel, such as for example, a chemical resistant tank or reactor such as those made of Teflon or polypropylene materials. In some embodiments, for example, where a glass grit is used, the first medium may be a concentrated $HF/HNO_3$ mixture. Any medium which will dissolve the grit, without dissolving the ruthenium to any substantial extent, may be used. The $HF/HNO_3$ may be employed, for example, in a 1:1 volumetric ratio, or alternatively may be diluted by up to about 4 parts water by volume. It will be readily understood by one skilled in the art that the amount of acid required to dissolve the grit will be at least a stoichiometric amount based upon the weight of the grit. Any suitable volume of acid may be used. The reaction may, for example, take place at room temperature for between about 20-30 minutes. Other temperatures and times may be used.

Following the dissolution of the grit, the remaining solids, which may include ruthenium and solid impurities, may be washed and/or filtered. The size of the ruthenium particles may depend on the type of cleaning method used. For example, with the glass bead blast method, the ruthenium particles may be in the range of approximately 200 microns to approximately 500 microns in diameter.

The solid impurities may be separated from the ruthenium particles by treatment of the ruthenium particles and solid impurities with a second medium in step 216. The second medium may be any suitable medium which may dissolve the solid impurities, but may not dissolve the ruthenium to any substantial extent. In some cases, such as where the grit is a soda lime glass, the solid impurities may include insoluble $CaF_2$ and $MgF_2$ which may be formed by reaction of Ca and Mg with HF. When the solid impurities include $CaF_2$ and $MgF_2$, the second medium may be concentrated $H_2SO_4$, which may dissolve the solid impurities and may leave ruthenium as unresolved residue. The treatment of the solid impurities and ruthenium particles with the concentrated $H_2SO_4$ may be conducted, for example, at room temperature for approximately 10 to 20 minutes, or until the reaction goes to completion. Other times and temperatures may be used. Treatment of the ruthenium particles and solid impurities with the second medium, step 216, may be conducted in any suitable vessel, such as for example, a chemical resistant tank or reactor such as those made of Teflon® or polypropylene materials.

The ruthenium particles which remain following dissolution of the solid impurities in step 216, may be recovered by filtration, in step 218. The filtration may be performed with, for example, a Teflon® filter. Other suitable filters may be used.

Method of Operating a Ruthenium Deposition Chamber

Figure 3:
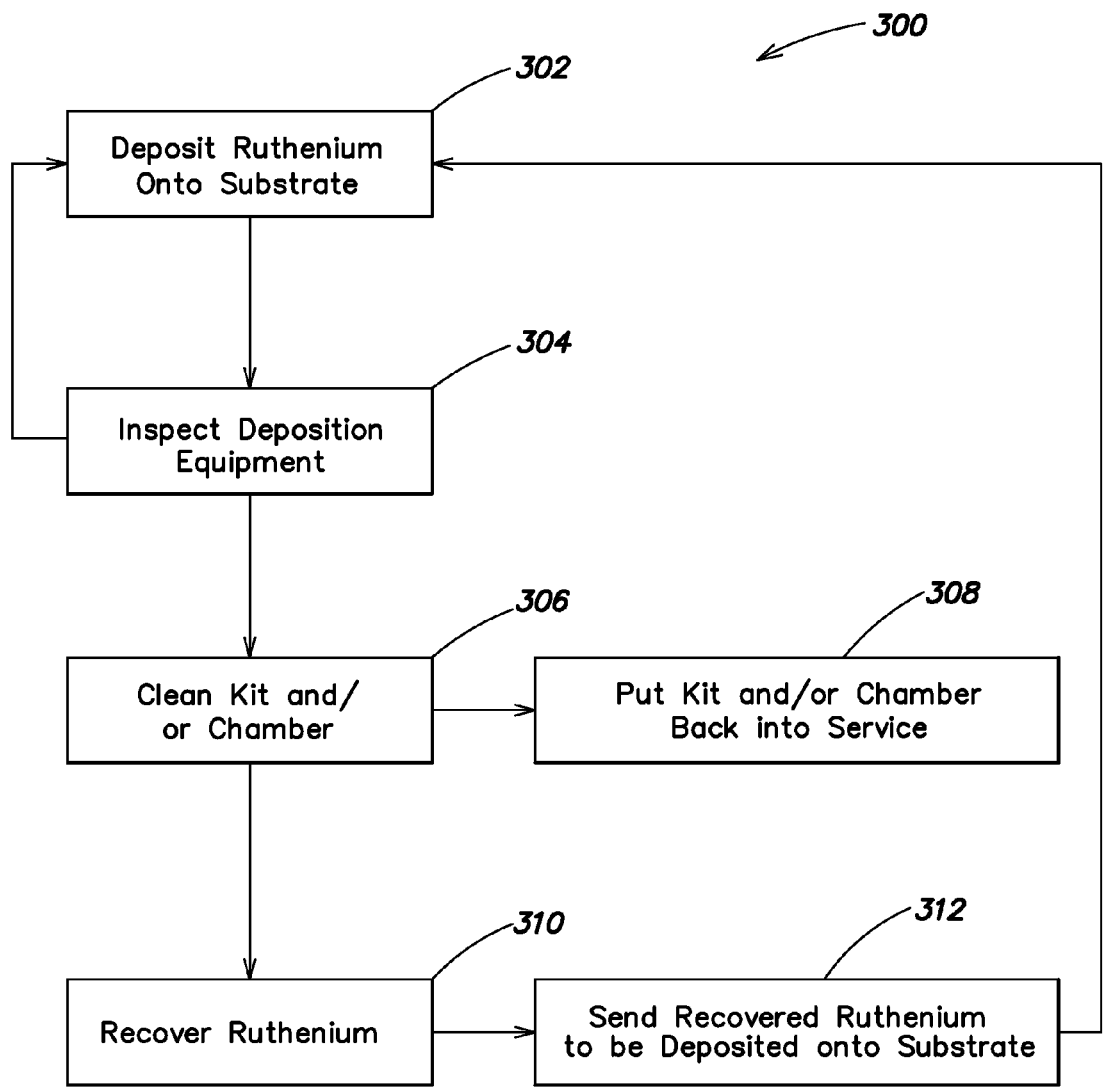
FIG. 3 is a flow chart of one or more embodiments of a method of operating a ruthenium deposition process chamber according to the present invention.

FIG. 3 depicts a flow chart of a method 300 for operating a ruthenium deposition chamber of the present invention.

Ruthenium may be conventionally deposited on a substrate in a ruthenium deposition chamber, in step 302. In one embodiment, the deposition equipment may be inspected, step 304, following each ruthenium deposition cycle. As described above, this inspection may consist of a visual inspection by a human operator, or an inspection conducted by a suitable sensor controlled by a computer or other programmable logic controller. In some embodiments, the inspection may include inspecting the thickness of any ruthenium coating on the deposition equipment. In some embodiments, the inspection may include inspecting the deposition equipment for flaked or otherwise separated particles of ruthenium. In other embodiments, the deposition equipment may be inspected following every X deposition cycles, where X is selected to be an integer between 2 and about 20 or any other suitable number of cycles. If the inspection determines that cleaning is not yet required because, for example, the thickness of any ruthenium coating on the deposition equipment is too thin to pose a risk of flaking before the next inspection is scheduled, the deposition process and inspection cycle may be resumed. If the inspection determines that cleaning is required, by for example, determining that ruthenium particles have actually separated from the deposition equipment, or that the thickness of any ruthenium coating indicates that the ruthenium might separate from the deposition equipment before the next inspection, then the deposition equipment may be taken out of service. The deposition equipment may then be cleaned in step 306 using, for example, cleaning process 100 (FIG. 1). The cleaned deposition equipment may be placed back in service in step 308.

A grit/ruthenium mixture generated in step 306 may be collected and the ruthenium recovered in step 310, using, for example, ruthenium recovery method 200 (FIG. 2). The recovered ruthenium may be sent to the deposition chamber for re-depositing, in step 312.

The foregoing description discloses only exemplary embodiments of the invention. Modifications of the above disclosed apparatus and methods which fall within the scope of the invention will be readily apparent to those of ordinary skill in the art. In some embodiments, the apparatus and methods of the present invention may be applied to semiconductor device processing and/or electronic device manufacturing.

Accordingly, while the present invention has been disclosed in connection with exemplary embodiments thereof, it should be understood that other embodiments may fall within the spirit and scope of the invention, as defined by the following claims.

The invention claimed is:

1. A method for cleaning electronic device deposition equipment comprising:
    providing deposition equipment wherein the deposition equipment is at least partially coated with a deposited metal to be cleaned from the deposition equipment, the deposited metal comprising ruthenium;
    blasting the deposition equipment with a grit to remove at least some of the deposited metal;
    separating at least some of the removed metal from the blasted grit to form a mixture comprising (i) a recovered metal comprising the ruthenium and (ii) solid impurities; and
    subsequently separating at least some of the ruthenium from the solid impurities.

2. The method of claim 1 wherein the deposition equipment is a process kit.

3. The method of claim 1 wherein the deposition equipment is a deposition chamber.

4. The method of claim 1 wherein the grit comprises a glass grit.

5. The method of claim 1 wherein the deposition equipment is partially masked prior to the blasting step.

6. A method for recovering a metal from electronic device deposition equipment comprising:
    providing deposition equipment wherein the deposition equipment is at least partially coated with a deposited metal;
    blasting the deposition equipment with a grit to remove at least some of the deposited metal to form a blasted grit and a removed metal; and
    separating at least some of the removed metal from the blasted grit to form a recovered metal, wherein separating at least some of the removed metal from the blasted grit to form a recovered metal comprises dissolving the blasted grit using a medium which does not dissolve the removed metal.

7. The method of claim 6 wherein the metal comprises ruthenium.

8. The method of claim 6 wherein the grit comprises a glass grit.

9. The method of claim 6 wherein the deposition equipment is partially masked prior to the blasting step.

10. The method of claim 6 wherein the deposition equipment is a process kit.

11. The method of claim 6 wherein the deposition equipment is a deposition chamber.

12. A method of operating a metal deposition chamber comprising:
    providing deposition equipment;
    depositing a metal on a substrate;
    inspecting the deposition equipment to determine whether more than a pre-selected thickness of the metal has been deposited on the deposition equipment;
    grit blasting at least some of the deposited metal from the deposition equipment to form a grit/metal mixture; and
    recovering at least some of the metal from the grit/metal mixture.

13. The method of claim 12 wherein the deposition equipment is a process kit.

14. The method of claim 12 wherein the deposition equipment is a deposition chamber.

15. The method of claim 12 wherein the metal is ruthenium.

16. The method of claim 12 wherein the deposition equipment is partially masked prior to the grit blasting step.

17. The method of claim 12 wherein the metal is recovered from the grit/metal mixture by dissolving the grit from the grit/metal mixture.

* * * * *